United States Patent
Kitade et al.

[11] Patent Number: 5,930,085
[45] Date of Patent: Jul. 27, 1999

[54] MAGNETORESISTIVE HEAD AND MAGNETIC RECORDING/REPRODUCING APPARATUS

[75] Inventors: Yasuhiro Kitade; Kazuo Kobayashi; Hideyuki Kikuchi; Hitoshi Kishi; Mitsuru Otagiri, all of Kanagawa, Japan

[73] Assignee: Fujitsu Limited, Kawasaki, Japan

[21] Appl. No.: 08/843,831

[22] Filed: Apr. 21, 1997

Related U.S. Application Data

[63] Continuation of application No. 08/495,313, Jun. 27, 1995, abandoned.

[30] Foreign Application Priority Data

Sep. 9, 1994 [JP] Japan .................................. 6-215893

[51] Int. Cl.$^6$ .................................................. G11B 5/127
[52] U.S. Cl. .................................. 360/113; 428/900
[58] Field of Search .......................... 360/113; 338/32 R; 428/900

[56] References Cited

U.S. PATENT DOCUMENTS

| | | | |
|---|---|---|---|
| 5,057,380 | 10/1991 | Hayashi et al. | 428/900 |
| 5,159,513 | 10/1992 | Dieny et al. | 360/113 |
| 5,206,590 | 4/1993 | Dieny et al. | 324/252 |
| 5,243,316 | 9/1993 | Sakakima et al. | 338/32 R |
| 5,304,975 | 4/1994 | Saito et al. | 360/113 |
| 5,373,238 | 12/1994 | McGuire et al. | 360/113 |
| 5,432,734 | 7/1995 | Kawano et al. | 360/113 |
| 5,549,978 | 8/1996 | Iwasaki et al. | 360/113 |
| 5,563,752 | 10/1996 | Komuro et al. | 360/113 |

FOREIGN PATENT DOCUMENTS 0506433  9/1992  European Pat. Off. .

OTHER PUBLICATIONS

Giant Magnetoresistance in FeNiCo/Cu Multilayers—Mustuko Jimbo et al.—Jpn. J. Appl. Phys. (1992).
Sakakima, H. Satomi, M.: Low–Field Giant Magnetoresistance in (Ni—Fe—Co/Cu/Co/Cu) Superlattices JP–Z: Jpn. Appl. Phys. vol. 31, Apr. 15, 1992 L484–L486.

Primary Examiner—Sara Crane
Attorney, Agent, or Firm—Greer, Burns & Crain, Ltd.

[57] ABSTRACT

The present invention relates to a magnetoresistive head having a spin valve MR film for use in a magnetic sensor, a magnetic head or the like. Of two ferromagnetic layers divided by a nonmagnetic metal film, at least ferromagnetic layer on the side being in contact with an antiferromagnetic layer is formed by a cobalt-nickel-iron alloy including at the rate of 5 to 40 atoms % of a nickel and 30 to 95 atoms % of cobalt.

9 Claims, 6 Drawing Sheets

------ dotted line showing magnetostriction zero by Sato et. al.

—·— dashed line showing small coercive force Hc by measurement dashed line showing region where $H_{c1} < 10$ Öe by measurement

MAGNETORESISTIVE HEAD AND MAGNETIC RECORDING/REPRODUCING APPARATUS

This application is a continuation of application Ser. No. 08/495,313 filed on Jun. 27, 1995, now abandoned.

BACKGROUND OF THE INVENTION

1. Field of the Invention

The present invention relates to a magnetoresistive head and, more particularly, to a magnetoresistive head having a spin valve MR film for use in a magnetic sensor, a magnetic head or the like.

2. Description of the Prior Art

In the magnetic sensor or the magnetic head, a magnetoresistance layer employing NiFe as magnetic material has been used. According to an increasing requirement for higher sensitivity of the magnetic sensor or the magnetic head, a GMR (Giant Magnetoresistance) film from which one can read large amplitude signals has been watched with interest. In particular, since a spin valve magnetoresistance film can be relatively readily fabricated and it has a large change rate of electric resistance in a low magnetic field in contrast to the conventional one, such film has recently been given much attention.

Devices using a spin valve magnetoresistance effect have been proposed in U.S. Pat. No. 5,206,590, for example. These devices have structures as shown in FIGS. 1A and 1B, for example.

In FIGS. 1A and 1B, in a magnetic field having specific magnitude, a backing layer 2, a first magnetic layer 3, a nonmagnetic metal layer 4, a second magnetic layer 5, and an antiferromagnetic film 6 are formed on a silicon substrate 1 by a sputter method. All layers from the backing layer 2 to the antiferromagnetic film 6 are patterned to have a rectangular shape. In addition, a pair of conductor leads 7a, 7b are formed at a distance in the longitudinal direction on antiferromagnetic film 6.

Materials constituting these layers, for example, tantalum (Ta) as the backing layer 2, iron-nickel (NiFe) as the first and second magnetic layers 3, 5, copper (Cu) as the nonmagnetic metal layer 4, and iron-manganese (FeMn) as the antiferromagnetic film 6 may be used.

Using the above, the spin valve magnetoresistive head has been completed.

The first magnetic layer 3 has rectangular magnetization $M_a$ in the longitudinal direction. The second magnetic layer 5 can be magnetized by being coupled with the antiferromagnetic film 6. A direction along magnetization $M_b$ is one direction of a short side of the rectangular shape. A signal magnetic field $H_{sig}$ derived from a magnetic recording medium is generated in the direction of the short side of these layers. When the signal magnetic field $H_{sig}$ is applied to the magnetoresistance transducer, the direction of the magnetization $M_a$ of the first magnetic layer 3 is caused to be inclined according to strength and direction of the signal magnetic field $H_{sig}$.

A component of the magnetization $M_a$ of the first magnetic layer 3, which is in the opposite direction to the magnetization $M_b$ of the second magnetic layer 5, serves as a primary factor to scatter electrons passing through these layers and thus increase the electric resistance of all layers. In contrast, since a component of the magnetization $M_a$ of the first magnetic layer 3, which is in the same direction to the magnetization $M_b$ of the second magnetic layer 5, does not scatter electrons passing through these layers, the electric resistance of all layers is decreased.

The electric resistance in sense current areas is varied in proportion to a cosine of a relative angle θ between the magnetization $M_a$ of the first magnetic layer 3 and the magnetization $M_b$ of the second magnetic layer 5, i.e., cos θ.

In order to change the electric resistance linearly against the signal magnetic field $H_{sig}$ derived from the magnetic recording/reproducing medium, the magnetization $M_a$ of the first magnetic layer 3 is intersected orthogonally with the magnetization $M_b$ of the second magnetic layer 5 in a state of zero signal magnetic field. The signal magnetic field $H_{sig}$ must be applied in the direction either identical to or opposite to the magnetization direction of the second magnetic layer 5, i.e., the fixed magnetization direction.

In the case the signal magnetic field $H_{sig}$ derived from a magnetic recording/reproducing medium is to be changed into an electric signal, change in electric resistance due to the signal magnetic field $H_{sig}$ can be transformed into change in voltage by flowing a constant electric current between the pair of conductor leads 7a, 7b. The change in the voltage is used as a reproducing electric signal.

In the meanwhile, in the device employing NiFe as material of the magnetic layer in which the spin valve magnetoresistance effect is caused, the change rate of electric resistance by the signal magnetic field is as small as 2.5%. Therefore, the device is insufficient for the magnetic sensor or the magnetic head of high sensitivity.

SUMMARY OF THE INVENTION

An object of the present invention is to provide a magnetoresistive head in which a larger change rate of the magnetic resistance can be derived against the signal magnetic field.

According to the magnetoresistive head of the present invention, at a minimum, the ferromagnetic layer in contact with the antiferromagnetic layer is formed by a cobalt-nickel-iron alloy, and the cobalt-nickel-iron alloy has 5 to 40 atoms % nickel and 30 to 95 atoms % cobalt.

Thereby, a change rate of electric resistance due to the spin valve magnetoresistance effect has become larger in the head according to the invention than the conventional head. Furthermore, if the ferromagnetic layer which is not in contact with the antiferromagnetic layer is also formed by a cobalt-nickel-iron alloy, the change rate of the electric resistance further increases. This is because the cobalt-nickel-iron alloy has a larger change rate of the electric resistance than does the iron-nickel alloy.

Furthermore, if the cobalt-nickel-iron alloy having zero magnetostriction is adopted, any damage the exchange interaction with the antiferromagnetic layer can be prevented.

Also, in the magnetoresistive head of the present invention, cobalt-nickel-iron alloys having mutually different compositions have been employed as the first and second ferromagnetic layers and have been formed with the nonmagnetic metal layer therebetween.

According to this, the change rate of electric resistance due to the spin valve magnetoresistance effect becomes larger than is the case with conventional heads. In addition, the composition of the first ferromagnetic layer, which is not in contact with the antiferromagnetic layer and which enables the magnetic field to be rotated easily by the signal magnetic field, can be used as the material constituting the second ferromagnetic layer so that proper read operation can be effected.

Nonetheless, it is preferable that the cobalt-nickel-iron alloy constituting the first ferromagnetic layer contains 40 to 50 atoms % of cobalt and 24 to 35 atoms % of nickel and that the cobalt-nickel-iron alloy constituting the second ferromagnetic layer contains 80 to 90 atoms % of cobalt and 20 atoms % or less of nickel.

In addition, since the coercive force of the first ferromagnetic layer is set to be less than 10 Oe, the direction of the magnetization can be readily rotated by the signal magnetic field. Further, if at least the crystal structure of the second ferromagnetic layer is formed as a face-centered cubic lattice, the antiferromagnetic layer contacted thereto can be easily formed.

Another magnetoresistive head of the present invention comprises a first ferromagnetic layer formed by a soft magnetic material of cobalt-nickel-iron alloy, a second ferromagnetic layer formed by a hard magnetic material of cobalt-nickel-iron alloy, iron-cobalt alloy or cobalt, and a nonmagnetic metal layer formed between the first and the second ferromagnetic layers.

For example, the cobalt-nickel-iron alloy constituting a hard magnetic material contains 65 atoms % or more of cobalt and 35 atoms % or less of nickel. The cobalt-nickel-iron alloy constituting a soft magnetic material contains 40 to 50 atoms % of cobalt and 24 to 35 atoms % of nickel.

Thereby, using the materials specified above, the change rate of electric resistance because of the spin valve magnetoresistance effect has become larger than the conventional head. In addition, since the second ferromagnetic layer is a hard magnetic layer, the coercive force is large and is not changed by the signal magnetic field, so that the antiferromagnetic layer is not required. As a result, throughput can be improved. In addition, since iron-manganese which has low corrosion resistance is not required as the antiferromagnetic layer, the corrosion resistance of the device can be improved according to the present invention.

In addition, since the coercive force of the first ferromagnetic layer is set to be less than 10 Oe, the direction of magnetization thereof can be readily rotated by the signal magnetic field.

DETAILED DESCRIPTION OF THE PREFERRED EMBODIMENTS

There will now be described preferred embodiments of the present invention hereinafter with reference to the accompanying drawings.

First Embodiment

Figure 1A:
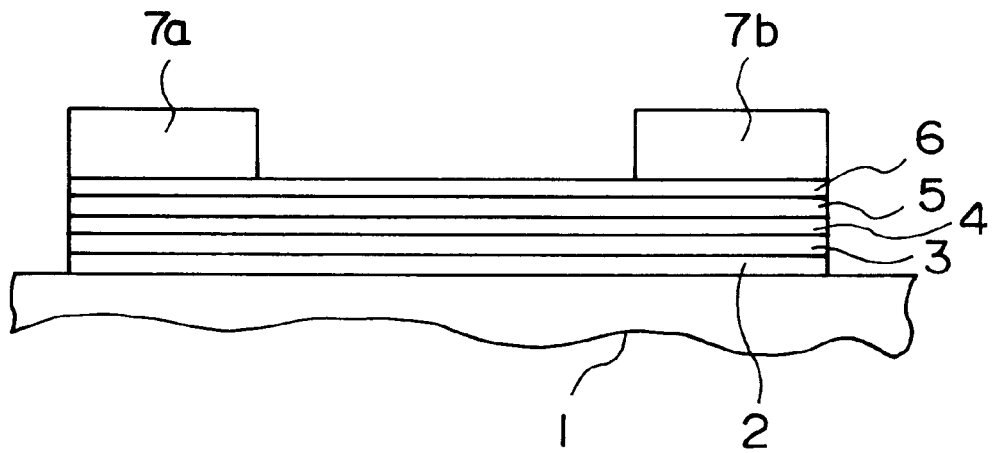
FIG. 1A is a side view showing a conventional spin valve magnetoresistive head.
Figure 1B:
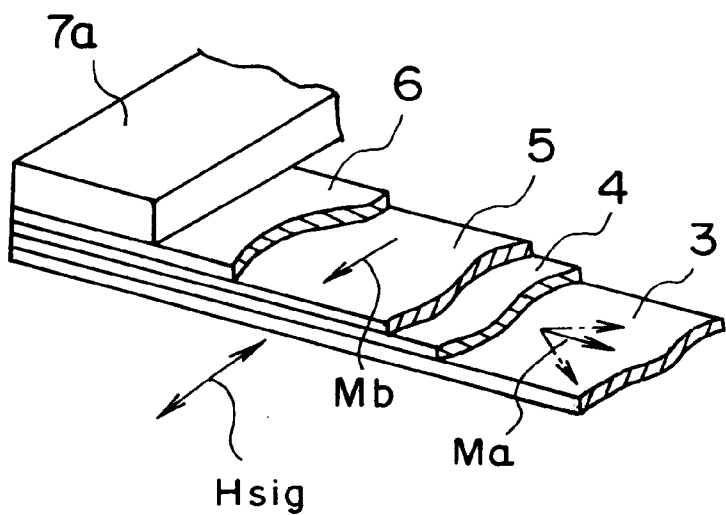
FIG. 1B is a perspective view showing the conventional spin valve magnetoresistive head in FIG. 1A which is partially sectioned.
Figure 2:
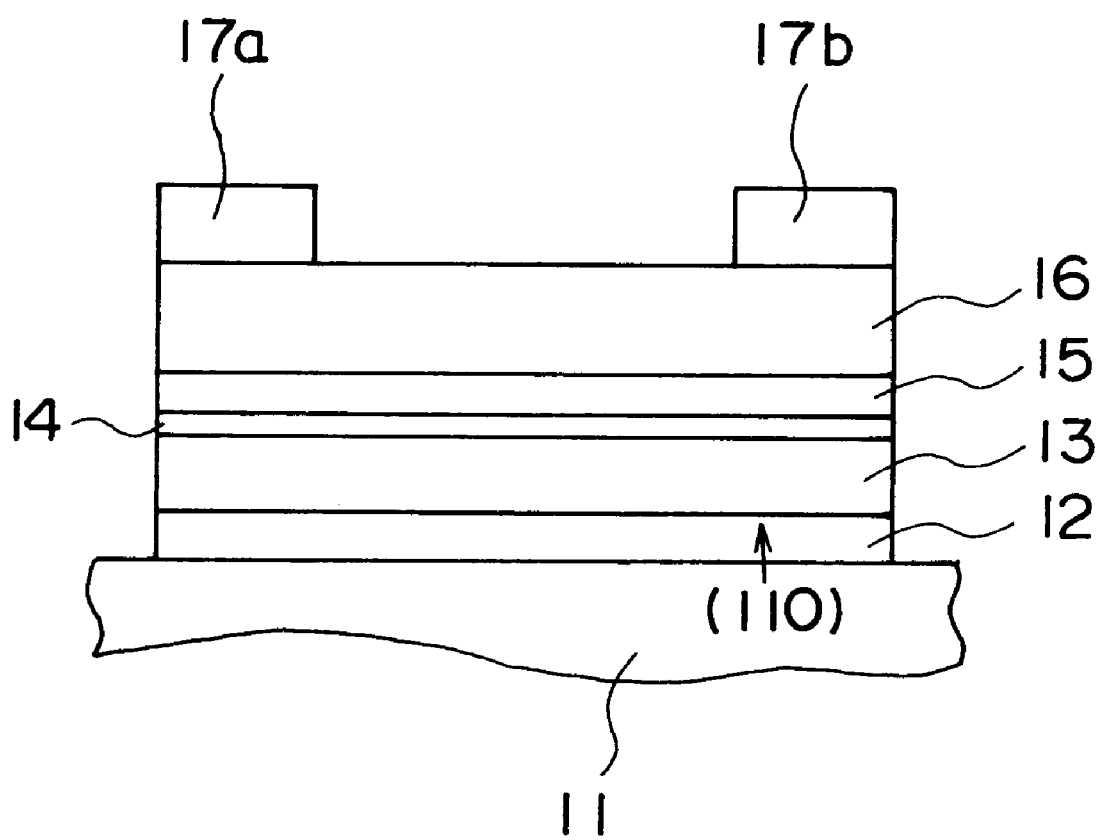
FIG. 2 is a side view showing a magnetoresistive head according to a first embodiment of the present invention.

FIG. 2 is a side view showing a multilayered structure of a spin valve magnetoresistive head according to a first embodiment of the present invention.

In FIG. 2, in an atmosphere of magnetic field having about 30 Oe (oersted), tantalum (Ta) as a backing layer 12 having a thickness of 60 Å, iron-nickel (NiFe) as a first ferromagnetic layer 13 having a thickness of 90 Å, copper (Cu) as a nonmagnetic metal layer 14 having a thickness of 20 Å, nickel-iron-cobalt (CoNiFe) as a second ferromagnetic layer 15 having a thickness of 40 Å, and iron-manganese (FeMn) as an antiferromagnetic film 16 having a thickness of 120 Å are formed in that order on a (110) face of a silicon substrate 11 by a sputter method.

A CoNiFe constituting the first ferromagnetic layer 13 is made of an alloy including, for example, 10 atoms % of nickel, 25 atoms % of iron, and 65 atoms % of cobalt. This alloy is referred to as $Co_{65}Ni_{10}Fe_{25}$ hereinafter.

Respective layers from the backing layer 12 to the antiferromagnetic layer 16 are patterned to have a rectangular plan shape. In addition, a pair of conductor leads 17a, 17b are formed at a distance in the longitudinal direction on antiferromagnetic layer 16.

In a state of zero external magnetic field, the direction of magnetization of the first ferromagnetic layers 13 is in the longitudinal direction. The direction of magnetization of the first ferromagnetic layer 13 is intersected orthogonally with the magnetization of the second ferromagnetic layer 15.

According to the spin valve magnetoresistive head so constructed above, the change rate of electric resistance becomes about 4%, which is larger in comparison with the conventional head.

The following are the reasons why a large change rate of electric resistance can be derived from forming the second ferromagnetic layer 15, connected to the antiferromagnetic film 16, with $Co_{65}Ni_{10}Fe_{25}$.

Figure 3:
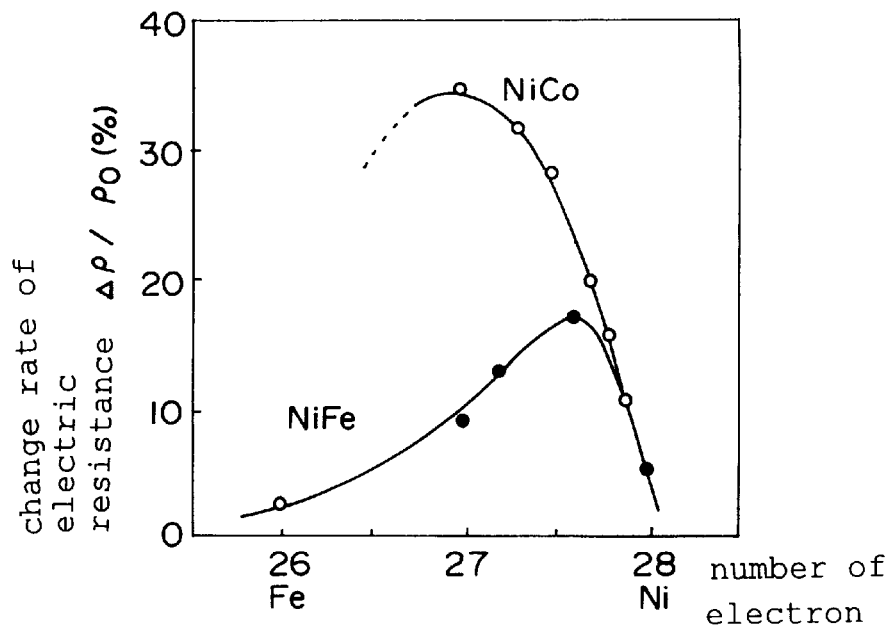
FIG. 3 is a characteristic view showing a relation between the number of electrons and the change rate of electric resistance when copper is used as the nonmagnetic metal layer and nickel-iron or nickel-cobalt is used as the magnetic thin film layer, and 30 nonmagnetic metal layer and 30 magnetic thin film layers are stacked.

FIG. 3 shows a change rate of electric resistance (electric resistivity) $\Delta\rho/\rho_0$ of a sample formed by stacking alternately 30 sheets of the nonmagnetic metal layer made of Cu and 30 sheets of the magnetic thin layer made of NiFe, and a change rate of electric resistance (electric resistivity) $\Delta\rho/\rho_0$ of another sample formed by stacking alternately 30 sheets of the nonmagnetic metal layer made of Cu and 30 sheets of the magnetic thin layer made of NiCo. FIG. 3 is based on a following article [1].

[1] M. Sato, S. Ishio and T. Miyazaki: J. Magn. Mater. 126 (1993) 462

As apparent from FIG. 3, when NiFe is used as the ferromagnetic layer, the change rate of the electric resistivity is about 15% at maximum. On the other hand, when NiCo, which is a cobalt system magnetic material, is used as the ferromagnetic layer, a change rate of the electric resistivity is increased as the number of electrons in the alloy becomes close to the number of electron of cobalt per se, i.e., 27, and becomes about 35% at maximum.

Figure 4:
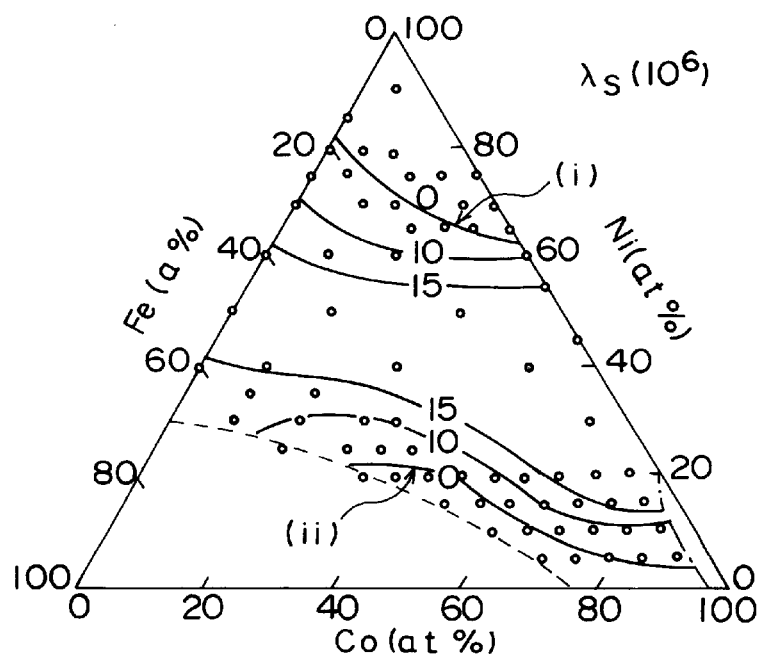
FIG. 4 is a diagram showing the relationship between a composition of cobalt-nickel-iron and magnetostriction.

Meanwhile, a magnitude of magnetostriction caused by a difference in a composition ratio of CoNiFe in a thin belt formed by rapidly cooling has been reported in a following article [2], for example, and is shown in FIG. 4. Here in FIG. 4, $\lambda_s$ is a saturation magnetostriction.

[2] T. Ohmori, S. Ishio and T. Miyazaki: 17th Japanese Society for Applied Magnetics, Summary (1993) 20

As material of the second ferromagnetic layer 15 connected to the antiferromagnetic layer 16, material having small coercive force ($H_c$) is desirable, when taking exchange coupling with the antiferromagnetic layer 16 into consideration. In order to reduce the coercive force, it is desirable to reduce the magnetostriction to zero. Referring to FIG. 4, there are two composition systems having zero magnetostriction in the CoNiFe alloy, which are respectively shown by (i), (ii) in FIG. 4.

In this case, if the composition ratio having a large change ratio of the electric resistivity is considered in FIG. 3, the (ii) system composition has greater atom % cobalt than the (i) system composition in FIG. 4, and the (ii) system composition exhibits large change rate of the electric resistivity that the (i) system. Both the (i) and (ii) system compositions have a crystal structure of a face-centered cubic lattice.

Consequently, if the CoNiFe alloy containing 30 to 95 atoms % of cobalt and 5 to 40 atoms % of nickel is used as the material of the second ferromagnetic layer 15, the magnetostriction becomes zero or is extremely close to zero and the large change rate of the electric resistivity can be attained. $Co_{65}Ni_{10}Fe_{25}$ described above is an example of such CoNiFe alloy.

Note that not only the second ferromagnetic layer 15 connected to the antiferromagnetic layer 16 but also the first ferromagnetic layer 13 may be formed by the CoNiFe alloy containing 30 to 95 atoms % of cobalt and 5 to 40 atoms % of nickel therein. In this case, larger change rate of the electric resistivity can be achieved than is the case where only the second ferromagnetic layer 15 is formed by the CoNiFe alloy.

Second Embodiment

Figure 5A:
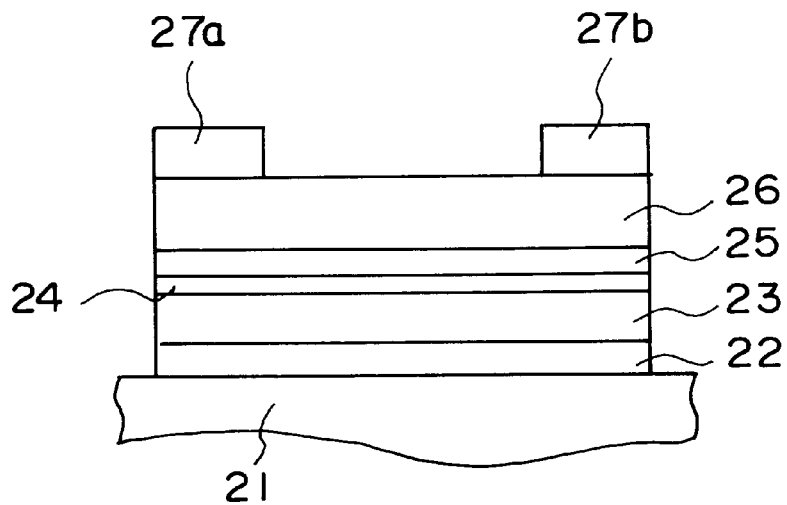
FIG. 5A is a side view showing a magnetoresistive head according to a second embodiment of the present invention.

FIG. 5A is a side view showing a multilayered structure of a spin valve magnetoresistive head according to a second embodiment of the present invention.

In FIG. 5A, in of magnetic field of about 30 Oe, tantalum (Ta) is a backing layer 22 and has a thickness of 60 Å, nickel-iron-cobalt (CoNiFe) is a first ferromagnetic layer 23 having a thickness of 90 Å, copper (Cu) is a nonmagnetic metal layer 24 having a thickness of 22 Å, nickel-iron-cobalt (CoNiFe) is a second ferromagnetic layer 25 having a thickness of 40 Å, and iron-manganese (FeMn) is an antiferromagnetic film 26 having a thickness of 120 Å. The materials are layered in the order given on a (110) face of a silicon substrate 21 by a sputtering method, the tantalum layer being adjacent to the silicon substrate.

A CoNiFe constituting the first ferromagnetic layer 23 is made of an alloy including, for example, 26 atoms % of nickel, 32 atoms % of iron, and 42 atoms % of cobalt. This alloy is referred to as $Co_{42}Ni_{26}Fe_{32}$ hereinafter. A CoNiFe constituting the second ferromagnetic layer 25 is made of an alloy including, for example, of 3 atoms % of nickel, 7 atoms % of iron, and 90 atoms % of cobalt. This alloy is referred to as $Co_{90}Ni_3Fe_7$ hereinafter.

Respective layers from the backing layer 22 to the antiferromagnetic layer 26 are patterned to have a rectangular plan shape. In addition, a pair of conductor leads 27a, 27b are formed at a distance from each other in the longitudinal direction on an antiferromagnetic layer 26.

In a state of zero external magnetic field, the direction of magnetization of the first ferromagnetic layers 23 is in the longitudinal direction. The direction of magnetization of the first ferromagnetic layer 23 is intersected orthogonally with the magnetization of the second ferromagnetic layer 25.

According to the spin valve magnetoresistive head so constructed above, a change rate of electric resistance becomes about 8%, which is about three times as large as that of a conventional head.

The following are the reasons why the first ferromagnetic layer 23 and the second ferromagnetic layer 25 have different composition ratios of the CoNiFe, respectively.

Since the direction of the magnetization of the first ferromagnetic layer 23 must be easily rotated by the signal magnetic field generated by the magnetic recording/reproducing medium, the first ferromagnetic layer 23 is needed to be formed using a soft magnetic material having a small coercive force. However, the direction of the magnetization of the second ferromagnetic layer 25 is fixed by the exchange interaction with the antiferromagnetic layer 26. Therefore, a requirement for the coercive force in the second ferromagnetic layer 25 is more generous than that of the first ferromagnetic layer 23.

Hence, in order to reduce the coercive force of CoNiFe constituting the first ferromagnetic layer 23, it is desirable to attain zero magnetostriction. In addition, in order to increase a change rate of the magnetic resistance in the first ferromagnetic layer 23, it is also desirable, based on FIG. 3, to form the first ferromagnetic layer 23 using the material including cobalt therein. Consequently, a composition on the line of the composition ratio of the (ii) composition system, which has been described in the first embodiment and shown in FIG. 4, can be selected as the composition of CoNiFe. This is because the smaller the magnetostriction becomes, the smaller the coercive force becomes.

Therefore, inventors of the present invention have examined the coercive force $H_c$ of CoNiFe having the composition ratio of the (ii) system and the composition ratios near the (ii) system. As a result, the result shown in FIG. 5A can be derived.

Figure 5B:
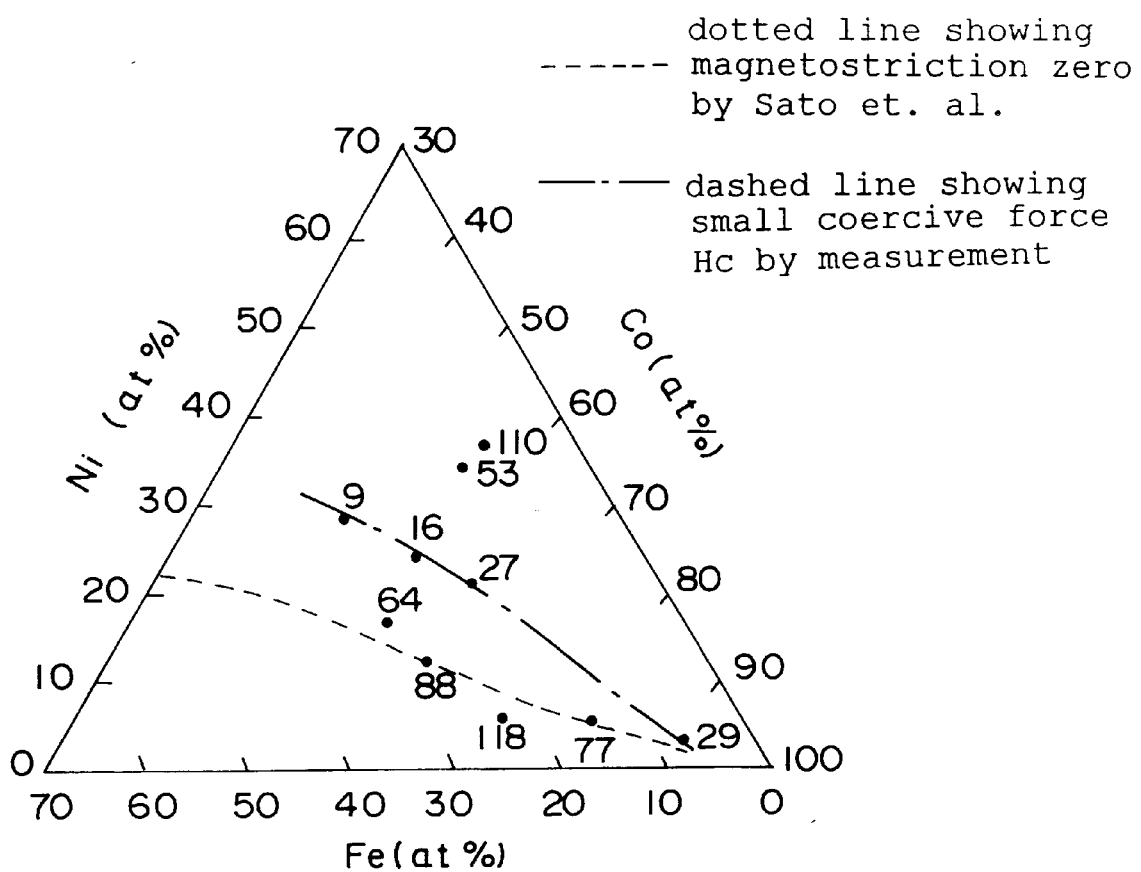
FIG. 5B is a diagram showing the relationship between a composition of cobalt-nickel-iron and coercive force.

In FIG. 5B, a dotted line showing the composition ratio of the (ii) system and a dashed line showing small coercive force do not coincide with each other, although the difference between the two is slight. However, this difference is caused because different fabricating methods have been utilized. The broken line showing the composition ratio of the (ii) system corresponding to a film which is formed as a thin belt by rapidly cooling. The dashed line showing small coercive force $H_c$ corresponding to system (ii) CoNiFe formed by the sputtering method. Since the film constituting the magnetoresistive head is in general formed by the sputtering method, the coercive force obtained by the sputtering method must be considered.

It is desirable that the coercive force $H_{c1}$ of the soft magnetic material constituting the first ferromagnetic layer 23 is smaller than 10 ($H_{c1}$<10).

According to the experiment, the composition of CoNiFe, which results in the coercive force $H_c$ smaller than 10, includes 40 to 50 atom % of cobalt, and 24 to 35 atoms % of nickel. $Co_{42}Ni_{26}Fe_{32}$ described above is an example of such composition.

In contrast, as has been described above, a requirement for the coercive force in CoNiFe constituting the second ferromagnetic layer 25 is more generous than that of the first ferromagnetic layer 23. However, if anisotropic magnetic field $H_{UA}$ caused by the antiferromagnetic layer 26 becomes smaller than the coercive force $H_{c2}$ in the second ferromagnetic layer 25, the direction of magnetization of the second ferromagnetic layer 25 can be readily reversed by an external magnetic field. If such reversal occurs, the spin valve magnetoresistance effect cannot be attained. The anisotropic magnetic field $H_{UA}$ is defined as a magnetic field that moves a center of a magnetic hysteresis curve (B-H curve), which shows a relation between the coercive force and the magnetic flux density, along the magnetic axis.

Therefore, the relation given by an equation (1) is required between the coercive force $H_{c2}$ in the second ferromagnetic layer 25 and the anisotropic magnetic field $H_{UA}$ generated by the antiferromagnetic layer 26. In this case, $H_{c2}$ is larger than zero.

$$H_{c2} < H_{UA} \qquad (1)$$

As stated above, when the material of the second ferromagnetic layer 25 is selected, such material must be selected wherein not only the desired anisotropic magnetic field $H_{UA}$ is provided, but also the crystal structure of the second ferromagnetic layer 25 has a face-centered cubic lattice. This is because, unless the crystal structure of the second ferromagnetic layer 25 has a face-centered cubic lattice, FeMn does not become an antiferromagnetic material.

If considering these conditions, the CoNiFe constituting the second ferromagnetic layer 25 must include 0 to 20 atoms % of nickel, 80 to 90 atoms % of cobalt, and remaining atoms % of iron. $Co_{90}Ni_3Fe_7$ described above is an example thereof. If there is 0 atoms % of nickel, the second ferromagnetic layer 25 is solely formed by cobalt-iron.

Third Embodiment

Figure 6A:
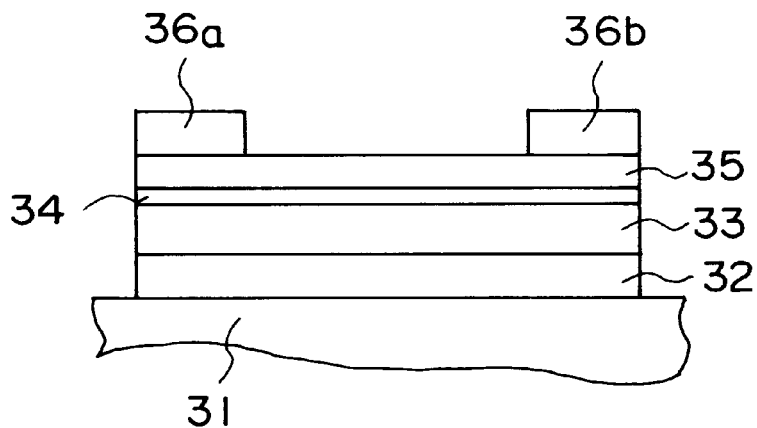
FIG. 6A is a side view showing a magnetoresistive head according to a third embodiment of the present invention.

FIG. 6A is a side view showing a multilayered structure of a spin valve magnetoresistive head according to a third embodiment of the present invention.

In FIG. 6A, in an atmosphere of magnetic field having about 30 Oe, tantalum (Ta) is a backing layer 32 having a thickness of 60 Å, nickel-iron-cobalt (CoNiFe) as a first ferromagnetic layer 33 having a thickness of 90 Å, copper (Cu) as a nonmagnetic metal layer 34 having a thickness of 20 Å, and nickel-iron-cobalt (CoNiFe) as a second ferromagnetic layer 35 having a thickness of 40 Å. The materials are layered in that order on a (110) face of a silicon substrate 31 by a sputtering method.

The CoNiFe constituting the first ferromagnetic layer 33 is made of an alloy including, for example, 26 atoms % of nickel, 32 atoms % of iron, and 42 atoms % of cobalt. This alloy is referred to as $Co_{42}Ni_{26}Fe_{32}$ hereinafter. A CoNiFe constituting the second ferromagnetic layer 35 is made of an alloy including, for example, 15 atoms % of nickel, 5 atoms % of iron, and 80 atoms % of cobalt. This alloy is referred to as $Co_{80}Ni_{15}Fe_5$ hereinafter.

Respective layers from the backing layer 32 to the second ferromagnetic layer 35 are patterned to have a rectangular plan shape. In addition, a pair of conductor leads 36a, 36b are formed at a distance from each other in the longitudinal direction on the second ferromagnetic layer 35 as shown in FIG. 6A.

In a state of zero external magnetic field, the direction of magnetization of the first ferromagnetic layers 33 is in the longitudinal direction. The direction of magnetization of the first ferromagnetic layer 33 is intersected orthogonally with the magnetization of the second ferromagnetic layer 35.

According to the spin valve magnetoresistive head so constructed above, change rate of electric resistance becomes about 8%, which is about three times as large as the conventional head.

Figure 6B:
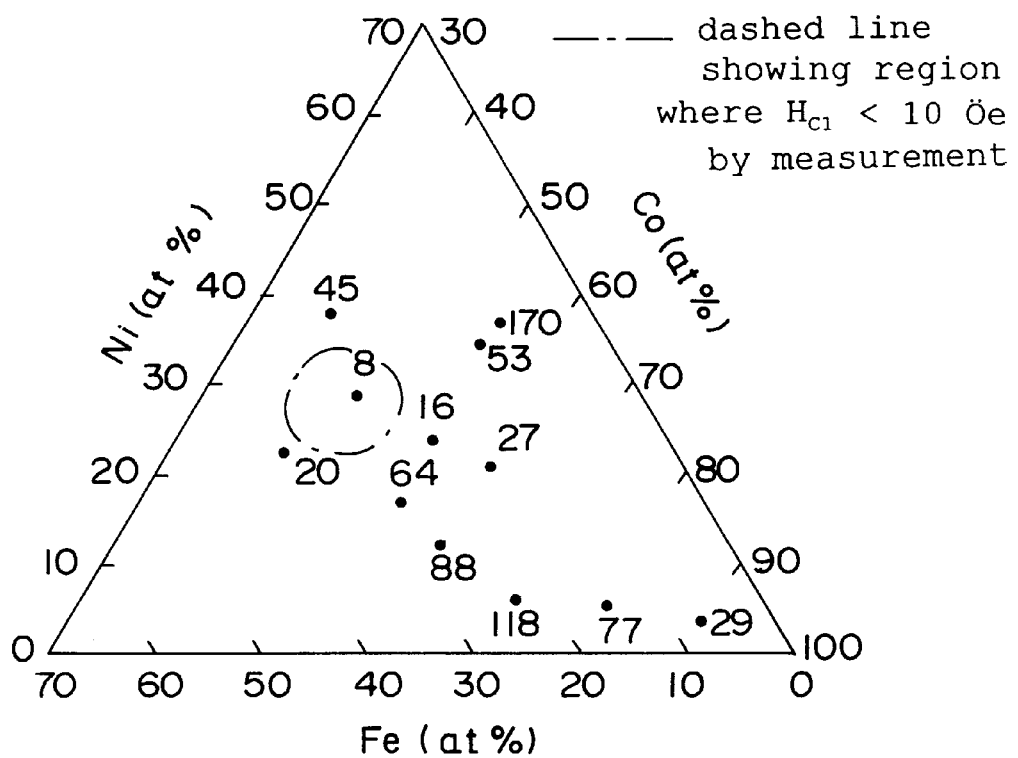
FIG. 6B is a diagram showing the relationship between a composition of cobalt-nickel-iron and coercive force.

In the meanwhile, in the spin valve magnetoresistive head according to the third embodiment, CoNiFe having the same composition as the first ferromagnetic layer 23 in the second embodiment can be selected as material of the first ferromagnetic layer 33, for the same reasons as described in the second embodiment. The first ferromagnetic layer 33 can have its composition of cobalt, iron, and nickel in a range that, as shown in FIG. 6B, the coercive force $H_{c1}$ is smaller than 10 Oe.

In contrast, the composition of the second ferromagnetic layer 35 differs from that of the second embodiment. As the CoNiFe constituting the second ferromagnetic layer 35 in the third embodiment, a material can be selected wherein the magnetization is not changed by the external magnetic field and further the change rate of the electric resistance becomes large.

In such case, no antiferromagnetic layer is required. Thus, regardless of the crystal state of the antiferromagnetic layer, the anisotropic magnetic field caused by the antiferromagnetic layer, and the exchange interaction with the antiferromagnetic layer, the composition of CoNiFe constituting the second ferromagnetic layer 35 can be determined.

Accordingly, zero magnetostriction of the second ferromagnetic layer 35 is not needed. The second ferromagnetic layer 35 may be formed by hard magnetic material in order to fix the direction of magnetization, and may predominantly contain cobalt in order to obtain large change rate of the electric resistance. As the second ferromagnetic layer 35, one may use a CoNiFe alloy having 0 to 35 atoms % of nickel and 65 to 100 atoms % of cobalt, Co single body (100% Co), or a FeCo alloy may be selected.

Thereby, a state of magnetizations each being in parallel and in the reverse direction to each other can be readily formed between the first and the second ferromagnetic layers 33 and 35. As a result, a large change rate of the electric resistance can be derived and therefore larger output can be obtained.

In addition, since the FeMn antiferromagnetic material is not required, corrosion of the FeMn layer does not have to be considered in manufacturing steps of the spin valve magnetoresistive head and the corrosion resistance of the device can be improved. In addition, since one layer is omitted from the multilayered structure, the throughput of the device can be improved.

Note that in the magnetoresistive heads according to the first to third embodiments, a set of layers including the first ferromagnetic layer to the antiferromagnetic layer or a set of layers including the first ferromagnetic layer to the second ferromagnetic layer have been formed, a multilayered structure which contains a plurality of these sets of layers may be utilized.

As described above, according to the present invention, since at least the ferromagnetic layer which is in contact with the antiferromagnetic layer is formed by a cobalt-nickel-iron alloy and the cobalt-nickel-iron alloy has 5 to 40 atoms % of nickel and 30 to 95 atoms % of cobalt, a larger change rate of the electric resistance due to the spin valve magnetoresistance effect can be attained than is the case using conventional heads. Furthermore, if the ferromagnetic layer not in contact with the antiferromagnetic layer is also formed by a cobalt-nickel-iron alloy, the change rate of the electric resistance can be further increased.

If the cobalt-nickel-iron alloy having zero magnetostriction is utilized, damage to the exchange interaction with the antiferromagnetic layer can be prevented.

Also, in the magnetoresistive head of the present invention, when the cobalt-nickel-iron alloys having mutually different compositions have been used as the first and second ferromagnetic layers and a nonmagnetic metal layer is placed therebetween, the change rate of electric resistance due to the spin valve magnetoresistance effect becomes larger than is the case for conventional heads. In addition, if a composition which enables the magnetic field not to be rotated easily by the external magnetic field is used as material constituting the second ferromagnetic layer being in contact with the antiferromagnetic layer and if a composition which enables the magnetic field to be rotated easily by the signal magnetic field is used as material constituting the first ferromagnetic layer which is not in contact with the antiferromagnetic layer, a proper read operation can be effected.

In this case, it is preferable that the cobalt-nickel-iron alloy constituting the first ferromagnetic layer contains 40 to 50 atoms % of cobalt and 24 to 35 atoms % of nickel, and that the cobalt-nickel-iron alloy constituting the second ferromagnetic layer contains 80 to 90 atoms % of cobalt and 20 atoms % or less of nickel.

In addition, since the coercive force of the first ferromagnetic layer is set to be less than 10 Oe, the direction of the magnetization can be readily rotated by the signal magnetic field. Furthermore, if at least the crystal structure of the second ferromagnetic layer is formed as a face-centered cubic lattice, the antiferromagnetic layer in contact therewith can be easily formed.

Another magnetoresistive head of the present invention comprises a first ferromagnetic layer formed by a soft magnetic material of cobalt-nickel-iron alloy, a second ferromagnetic layer formed by a hard magnetic material of cobalt-nickel-iron alloy or iron-cobalt alloy or cobalt, and a nonmagnetic metal layer formed between the first and the second ferromagnetic layers the change rate of electric resistance due to the spin valve magnetoresistance effect can be increased to a larger valve that that for a conventional head.

For example, the cobalt-nickel-iron alloy constituting a hard magnetic material contains 65 atoms % or more of cobalt and 35 atoms % or less of nickel. The cobalt-nickel-iron alloy constituting a soft magnetic material contains 40 to 50 atoms % of cobalt and 24 to 35 atoms % of nickel.

In addition, when the second ferromagnetic layer is formed by the hard magnetic layer, the coercive force becomes large and is not changed by the signal magnetic field. As a result, since the antiferromagnetic layer is not required, the throughput can be improved and also the corrosion resistance of the device can be improved according to the present invention.

In addition, since the coercive force of the first ferromagnetic layer is set to be less than 10 Oe, the direction of magnetization thereof can be readily rotated by the signal magnetic field.

Figure 7A:
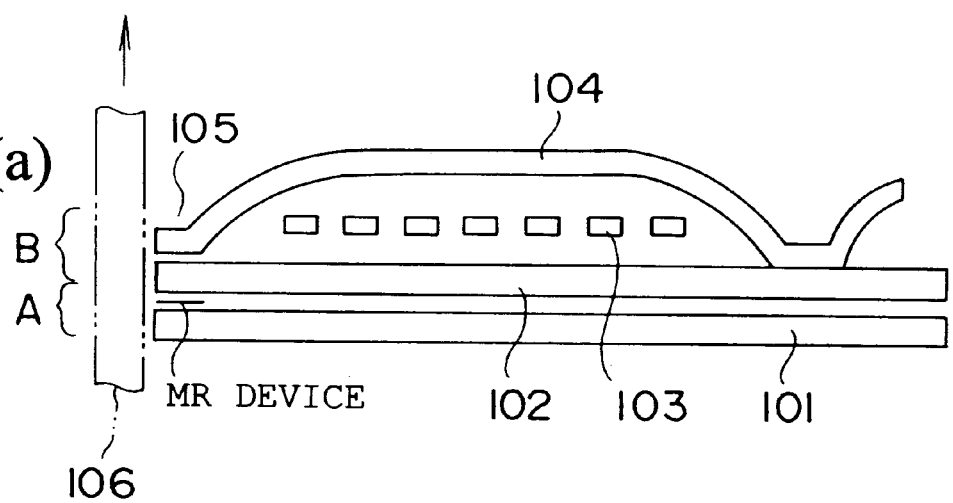
FIG. 7A is a side view showing a common type magnetic recording/reproducing apparatus in which the MR device according to the embodiment of the present invention is incorporated.
Figure 7B:
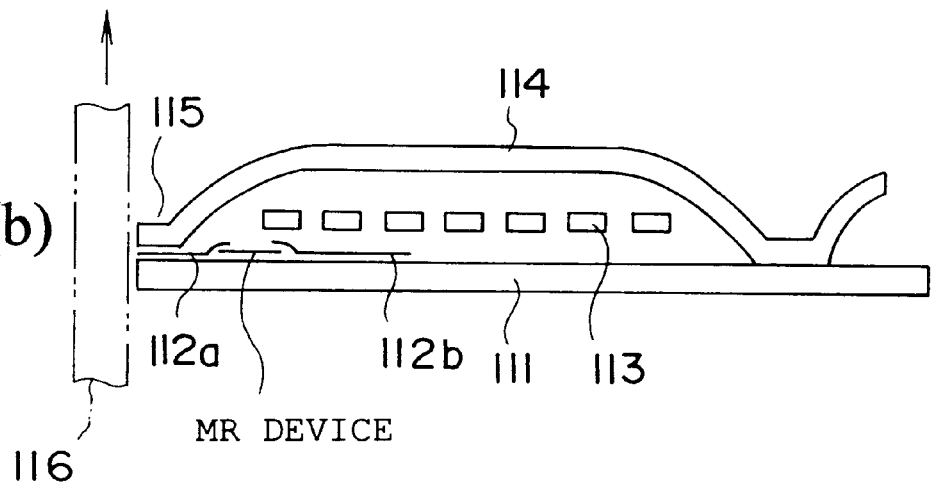
FIG. 7B is a side view showing an in-gap type magnetic recording/reproducing apparatus having a flux guide, in which the MR device according to the embodiment of the present invention is incorporated.
Figure 7C:
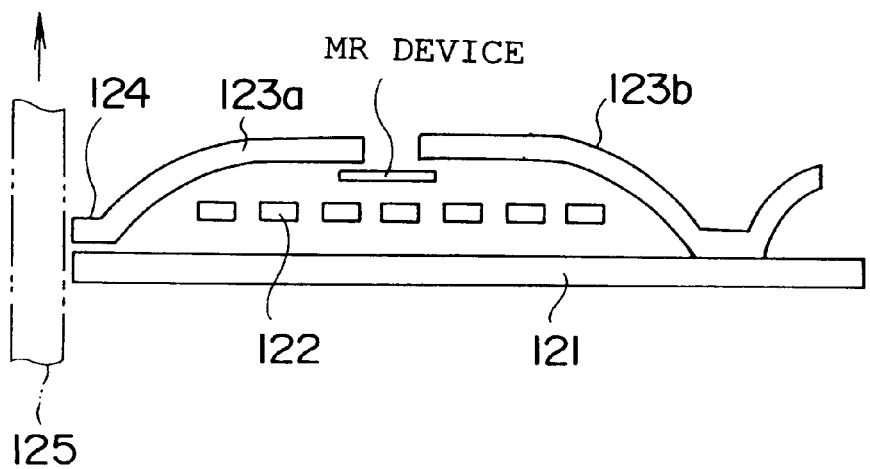
FIG. 7C is a side view showing a yoke type magnetic recording/reproducing apparatus in which the MR device according to an embodiment of the present invention is incorporated.

Next, with reference to FIGS. 7A to 7C, a magnetic recording apparatus according to the embodiment of the present invention into which the MR device described above is incorporated will be explained. FIGS. 7A to 7C are sectional views each showing a magnetic head portion of the magnetic recording/reproducing apparatus.

FIG. 7A shows a composite type MR head. The A portion denotes a reproducing head, and the B portion denotes a recording head. A soft magnetic layer 102 is commonly used as a magnetic shield of the reproducing head and a magnetic pole of the recording head.

As shown in FIG. 7A, in the reproducing head portion, soft magnetic layers 101, 102 used as the magnetic shield are positioned to oppose each other at a distance. The MR device described above is put into a gap of a portion 105 facing to a magnetic recording medium 106. A leakage magnetic field generated from the magnetic recording medium 106 can be directly detected.

In the reproducing head portion, soft magnetic layers 102, 104 used as the magnetic pole are positioned to oppose to each other at a distance. A coil 103 which generates magnetic flux passing through the soft magnetic layers 102, 104 is formed in a gap of the soft magnetic layers 102, 104. By generating the leakage magnetic field from the gap of the facing portion 105 by this magnetic flux, the magnetic recording medium 106 can record various information.

FIG. 7B shows an in-gap type MR head. As shown in FIG. 7B, soft magnetic layers 111, 114 used as the magnetic pole are positioned to oppose each other at a distance.

The MR device described above is put into a gap of a portion 115 facing to a magnetic recording medium 116. A coil 113 which generates magnetic flux passing through the soft magnetic layers 111, 114 is formed in a gap of the soft magnetic layers 111, 114.

In order to avoid corrosion or be in direct contact with the magnetic recording medium, the MR device is positioned inside of the magnetic head, without being protruded to the portion 115 facing to the magnetic recording medium 116. A flux guide 112a which is electrically isolated from the MR device and magnetically coupled thereto is protruded to the facing portion 115. The leakage magnetic field generated by the magnetic recording medium 116 is entered into the flux guide 112a and then detected by the MR device. At the other end of the MR device, another flux guide 112b, which is electrically isolated from the MR device and magnetically coupled thereto, is formed to guide the magnetic flux from the MR device to the soft magnetic layers 111, 114.

FIG. 7C shows a yoke type MR head. As shown in FIG. 7C, soft magnetic layers 121, 123a and 123b used as the magnetic pole are positioned to oppose each other at a distance. A coil 122 which generates magnetic flux passing through the soft magnetic layers 121, 123a and 123b is formed in a gap of the soft magnetic layers 121, 123a and 123b. The MR device is positioned at an end of the soft magnetic layers 123a and 123b such that it is isolated electrically from the soft magnetic layers 123a and 123b and magnetically coupled thereto. The leakage magnetic field is generated from the gap of the facing portion 124 by the magnetic flux which is generated by the coil 122 and passes through the soft magnetic layers 121, 123a and 123b, so that the magnetic recording medium 125 can record various information.

In the magnetic recording apparatus shown in FIGS. 7A to 7C, a substrate on which the magnetic head is formed and insulating films between the soft magnetic layers etc. are omitted.

According to the above magnetic recording/reproducing apparatus, since the MR devices according to the first to third embodiments are used, the magnetic recording/reproducing apparatus having a magnetically stable characteristic and a high yield of the device can be provided.

Note that the MR device according to the present invention may be used in various magnetic recording apparatus as well as the above magnetic recording apparatus.

Further, the MR device may be used in a reproducing-only magnetic recording apparatus.

What is claimed is:

1. A magnetoresistive head comprising:
   (a) a multilayer laminate including
      (1) a first ferromagnetic layer being made of a soft magnetic material of a cobalt-nickel-iron alloy containing about 40 to 50 atoms % cobalt and 24 to 35 atoms % nickel, and having a coercive force less than about 10 Oe,
      (2) a nonmagnetic metal layer on said first ferromagnetic layer,
      (3) a second ferromagnetic layer on said nonmagnetic metal layer, which is made of cobalt-nickel-iron alloy containing about 30 to 95 atoms % cobalt and 5 to 40 atoms % nickel, has about zero magnetostriction, and has a face-centered cubic structure, and
      (4) an antiferromagnetic layer on said second ferromagnetic layer; and
   (b) a pair of conductive leads contacting the multilayer laminate for passing a current through said laminate to detect magnetoresistance.

2. A magnetoresistive head according to claim 1, wherein said second ferromagnetic layer is made of a cobalt-nickel-iron alloy containing about 80 to 90 atoms % cobalt and about 20 atoms % or less nickel, and has a coercive force less than an anisotropic magnetic field caused by said antiferromagnetic layer.

3. A magnetic recording/reproducing apparatus comprising:
   (a) a magnetic recording medium which records a magnetic signal; and
   (b) a magnetoresistive head having
      (1) a multilayer laminate including
         (i) a first ferromagnetic layer being made of a soft magnetic material of a cobalt-nickel-iron alloy containing about 40 to 50 atoms % cobalt and 24 to 35 atoms % nickel, and having a coercive force less than about 10 Oe
         (ii) a nonmagnetic metal layer on said first ferromagnetic layer,
         (iii) a second ferromagnetic layer on said nonmagnetic metal layer, which is made of a cobalt-nickel-iron alloy containing about 30 to 95 atoms % cobalt and 5 to 40 atoms % nickel, has about zero magnetostriction, and has a face-centered cubic structure, and
         (iv) an antiferromagnetic layer on said second ferromagnetic layer, and
      (2) a pair of conductive leads contacting the multilayer laminate for passing a current through said laminate to detect magnetoresistance.

4. A magnetoresistive head comprising:
   (a) a multilayer laminate including
      (1) a first ferromagnetic layer being made of a soft magnetic material of a cobalt-nickel-iron alloy containing about 30 to 95 atoms % cobalt and 20 atoms % or less nickel, and having zero magnetostriction,
      (2) a nonmagnetic metal layer on said first ferromagnetic layer,
      (3) a second ferromagnetic layer on said nonmagnetic metal layer, which is made of a cobalt-nickel-iron alloy containing about 30 to 95 atoms % cobalt and 5 to 40 atoms % nickel, has about zero magnetostriction, and has a face-centered cubic structure, and
      (4) an antiferromagnetic layer on said second ferromagnetic layer; and
   (b) a pair of conductive leads contacting the multilayer laminate for passing a current through said laminate to detect magnetoresistance.

5. A magnetoresistive according to claim 4, wherein said second ferromagnetic layer is made of a cobalt-nickel-iron alloy containing about 80 to 90 atoms % cobalt and about 20 atoms % or less nickel, and has a coercive force less than an anisotropic magnetic field caused by said antiferromagnetic layer.

6. A magnetic recording/reproducing apparatus comprising:
   (a) a magnetic recording medium which records a magnetic signal; and
   (b) a magnetoresistive head having
      (1) a multilayer laminate including
         (i) a first ferromagnetic layer being made of a soft magnetic material of a cobalt-nickel-iron alloy containing about 30 to 95 atoms % cobalt and 20 atoms % or less nickel, and having zero magnetostriction,
         (ii) a nonmagnetic metal layer on said first ferromagnetic layer,
         (iii) a second ferromagnetic layer on said nonmagnetic metal layer, which is made of a cobalt-nickel-iron alloy containing about 30 to 95 atoms % cobalt and 5 to 40 atoms % nickel, has about zero magnetostriction, and has a face-centered cubic structure, and
         (iv) an antiferromagnetic layer on said second ferromagnetic layer, and
      (2) a pair of conductive leads contacting the multilayer laminate for passing a current through said laminate to detect magnetoresistance.

7. A magnetoresistive head for reading a signal magnetic field comprising:
   (a) a multilayer laminate including
      (1) a first ferromagnetic layer being made of a soft magnetic material in which a direction of magnetization changes corresponding to a strength of said signal magnetic field,
      (2) a nonmagnetic metal layer on said first ferromagnetic layer,
      (3) a second ferromagnetic layer on said nonmagnetic metal layer, which is made of a cobalt-nickel-iron alloy containing about 30 to 95 atoms % cobalt and 5 to 40 atoms % nickel, has about zero magnetostriction so as to lower a coercive force, and has a face-centered cubic structure, and
      (4) an antiferromagnetic layer on said second ferromagnetic layer which pins a direction of magnetization of said second ferromagnetic layer by an exchange interaction while said signal magnetic field is applied to said second ferromagnetic layer and has an isotropic magnetic field (Hua) larger than said coercive force of said second magnetic layer; and
   (b) a pair of conductive leads contacting the multilayer laminate for passing a current through said laminate to detect magnetoresistance.

8. A magnetoresistive head according to claim 7, wherein said coercive force of said second ferromagnetic layer is 10 Oe or less.

9. A magnetic recording/reproducing apparatus comprising:
(a) a magnetic recording medium which records a magnetic signal; and
(b) a magnetoresistive head for reading a signal magnetic field having
   (1) a multilayer laminate including
      (i) a first ferromagnetic layer being made of a soft magnetic material in which a direction of magnetization changes corresponding to a strength of said signal magnetic field,
      (ii) a nonmagnetic metal layer on said first ferromagnetic layer,
      (iii) a second ferromagnetic layer on said nonmagnetic metal layer, which is made of a cobalt-nickel-iron alloy containing about 30 to 95 atoms % cobalt and 5 to 40 atoms % nickel, has about zero magnetostriction, and has a face-centered cubic structure, and
      (iv) an antiferromagnetic layer on said second ferromagnetic layer, and
   (2) a pair of conductive leads contacting the multilayer laminate for passing a current through said laminate to detect magnetoresistance.

* * * * *